(12) United States Patent
Stiens et al.

(10) Patent No.: US 11,247,276 B2
(45) Date of Patent: Feb. 15, 2022

(54) COATED CUTTING TOOL WITH H-ALN AND TI1-XALXCYNZ LAYERS

(71) Applicant: WALTER AG, Tubingen (DE)

(72) Inventors: Dirk Stiens, Tubingen (DE); Thorsten Manns, Tubingen (DE)

(73) Assignee: Walter AG, Tubingen (DE)

( * ) Notice: Subject to any disclaimer, the term of this patent is extended or adjusted under 35 U.S.C. 154(b) by 498 days.

(21) Appl. No.: 16/090,287

(22) PCT Filed: Mar. 31, 2017

(86) PCT No.: PCT/EP2017/057728
§ 371 (c)(1),
(2) Date: Oct. 1, 2018

(87) PCT Pub. No.: WO2017/167980
PCT Pub. Date: Oct. 5, 2017

(65) Prior Publication Data
US 2019/0111497 A1   Apr. 18, 2019

(30) Foreign Application Priority Data

Mar. 31, 2016 (EP) .................................... 16163243

(51) Int. Cl.
*B23B 27/14*   (2006.01)
*C23C 16/36*   (2006.01)
(Continued)

(52) U.S. Cl.
CPC .......... *B23B 27/148* (2013.01); *C23C 16/303* (2013.01); *C23C 16/34* (2013.01);
(Continued)

(58) Field of Classification Search
CPC ..... B23B 27/148; C23C 16/303; C23C 16/36; C23C 2224/08; C23C 2224/24; C23C 2224/32; C23C 2228/105; C23C 2228/36
(Continued)

(56) References Cited

U.S. PATENT DOCUMENTS 8,394,513 B2  3/2013  Van Den Berg et al.
2007/0218313 A1*  9/2007  Okada .................. B23C 5/28
428/698

(Continued)

FOREIGN PATENT DOCUMENTS

EP     0592986 A1    4/1994
EP     3000913 A1    3/2016
(Continued)

OTHER PUBLICATIONS

Endler I et al: "Novel aluminum-rich Ti"1"-"xAl"xN coatings by LPCVD", Surface and Coatings Technology, Elsevier BV, Amsterdam, NL. vol. 203, No. 5-7, Dec. 25, 2008, pp. 530-533.
(Continued)

*Primary Examiner* — Archene A Turner
(74) *Attorney, Agent, or Firm* — Corinne R. Gorski

(57) ABSTRACT

A coated cutting tool includes a substrate of cemented carbide, cermet, ceramics, steel or cubic boron nitride and a multi-layered wear resistant coating. The multi-layered wear resistant coating has a total thickness from 5 to 25 μm and includes refractory coating layers deposited by chemical vapour deposition (CVD) or moderate temperature chemical vapour deposition (MT-CVD). The multi-layered wear resistant coating has at least one pair of layers (a) and (b), with layer (b) being deposited immediately on top of layer (a). Layer (a) is a layer of aluminium nitride having hexagonal crystal structure (h-AlN) and a thickness from 10 nm to 750 nm. Layer (b) is a layer of titanium aluminium nitride or
(Continued)

(sample # 1 – cross section)

titanium aluminium carbonitride represented by the general formula $Ti_{1-x}Al_xC_yN_z$ with $0.4 \leq x \leq 0.95$, $0 \leq y \leq 0.10$ and $0.85 \leq z \leq 1.15$, having a thickness from 0.5 μm to 15 μm, and at least 90% of the $Ti_{1-x}Al_xC_yN_z$ of layer (b) has a face-centered cubic (fcc) crystal structure.

12 Claims, 6 Drawing Sheets

(51) Int. Cl.
  *C23C 28/00* (2006.01)
  *C23C 16/34* (2006.01)
  *C23C 28/04* (2006.01)
  *C23C 16/30* (2006.01)
(52) U.S. Cl.
  CPC .............. *C23C 16/36* (2013.01); *C23C 28/04* (2013.01); *C23C 28/042* (2013.01); *C23C 28/044* (2013.01); *C23C 28/42* (2013.01); *C23C 28/44* (2013.01); *B23B 2224/08* (2013.01); *B23B 2224/24* (2013.01); *B23B 2224/32* (2013.01); *B23B 2228/04* (2013.01); *B23B 2228/105* (2013.01); *B23B 2228/36* (2013.01)
(58) Field of Classification Search
  USPC ........... 51/307, 309; 428/216, 336, 697, 698
  See application file for complete search history.

(56) References Cited

U.S. PATENT DOCUMENTS

| | | | |
|---|---|---|---|
| 2009/0274899 | A1 | 11/2009 | Sundstrom et al. |
| 2011/0011197 | A1 | 5/2011 | Johansson et al. |
| 2016/0053372 | A1 | 2/2016 | Stiens et al. |

FOREIGN PATENT DOCUMENTS

| | | | | |
|---|---|---|---|---|
| JP | 2002273607 | A | | 9/2002 |
| JP | 2006305714 | A | | 11/2006 |
| JP | 2013-233602 | A | | 11/2013 |
| JP | 2014184522 | A | | 10/2014 |
| JP | 2015-124407 | | * | 7/2015 |
| JP | 2016-030319 | A | | 3/2016 |
| WO | 2013087848 | A1 | | 6/2013 |

OTHER PUBLICATIONS

Huang H H et al: Effect of NH3 on the growth characterization of TiN films at low temperature, Journal of Crystal Growth, Elsevier, Amsterdam, NL, vol. 240, No. 3-4, May 1, 2002, pp. 513-520.

Li et al. "Arc ion plating deposition of TiN/AlN-TiAlN composite film Abrasion resistance", Equiment Manufacturing Technology, Edition No. 2, pp. 1-2, Dec. 31, 2010.

* cited by examiner

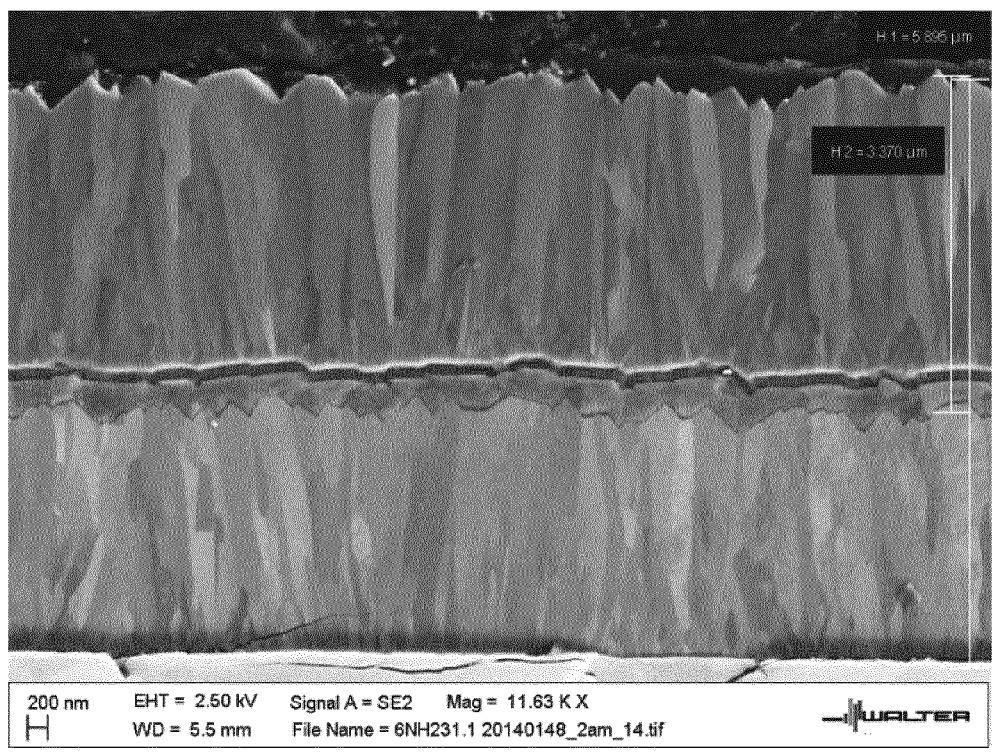
*Figure 1a (sample # 1 – cross section)*
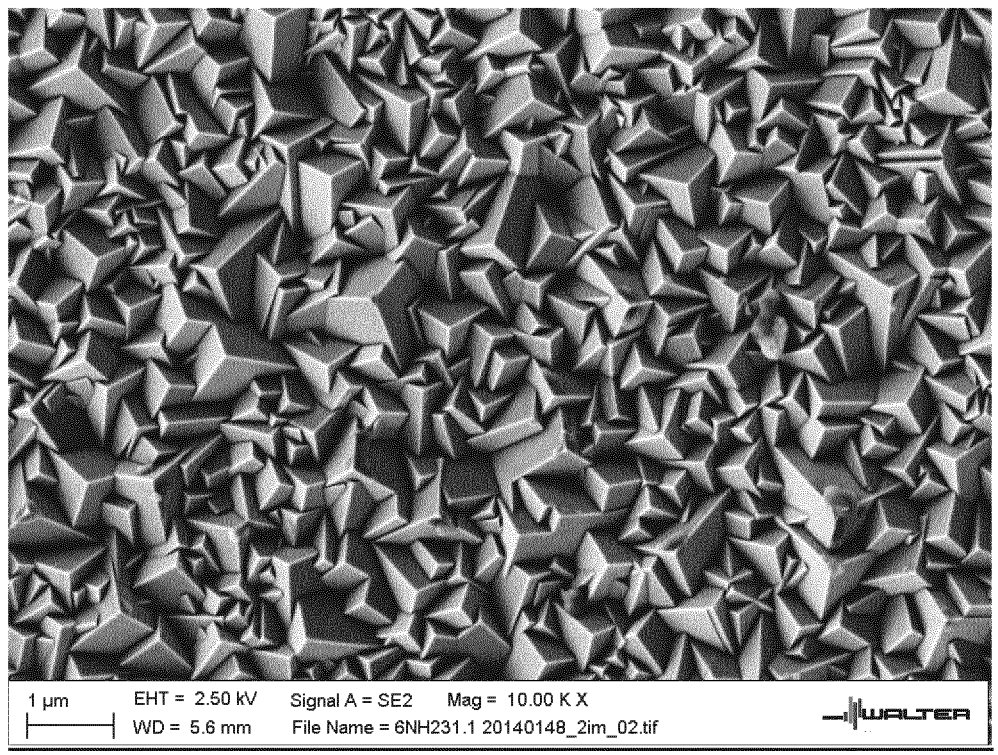
*Figure 1b (sample # 1 – top view)*

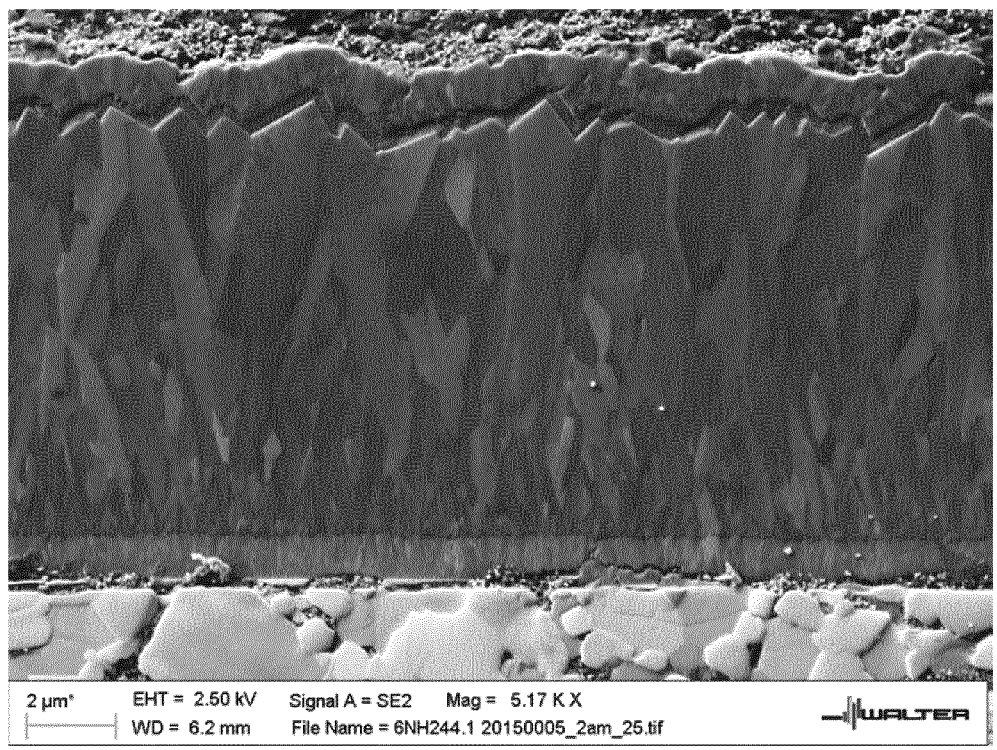
*Figure 2a (sample # 2 – cross section)*
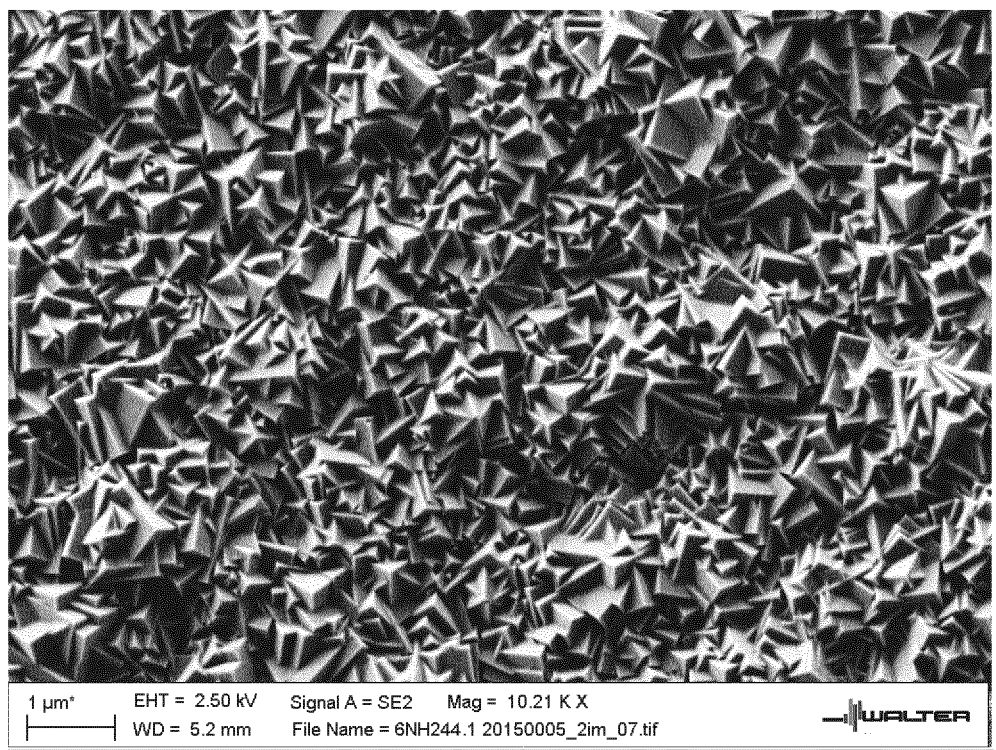
*Figure 2b (sample # 2 – top view)*

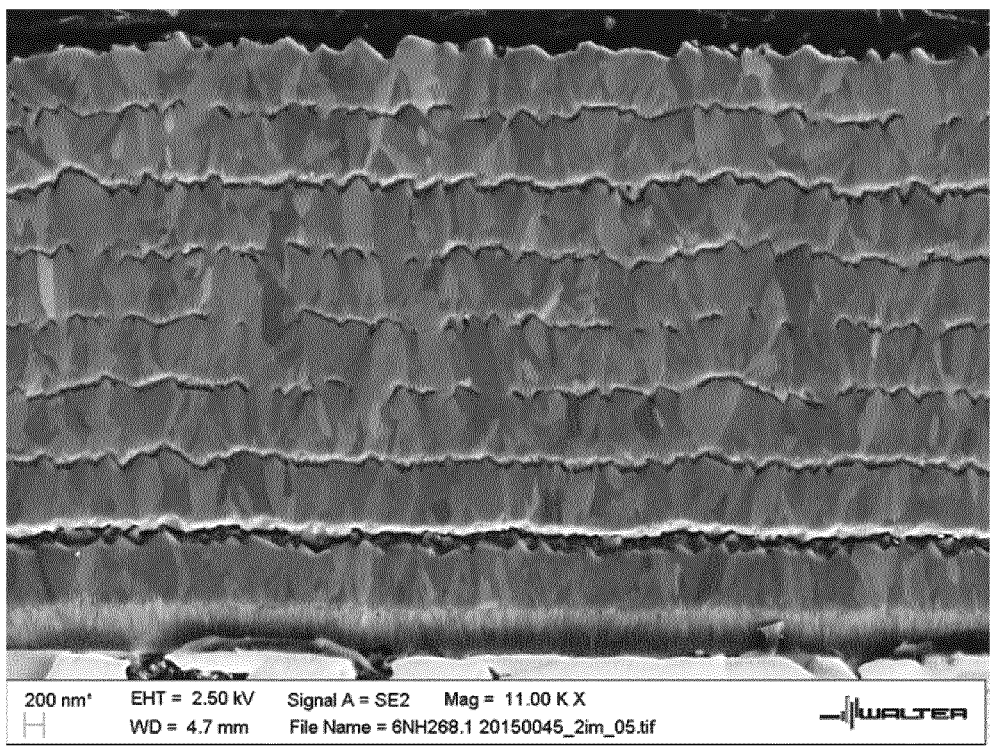
Figure 3a (sample # 3 – cross section)
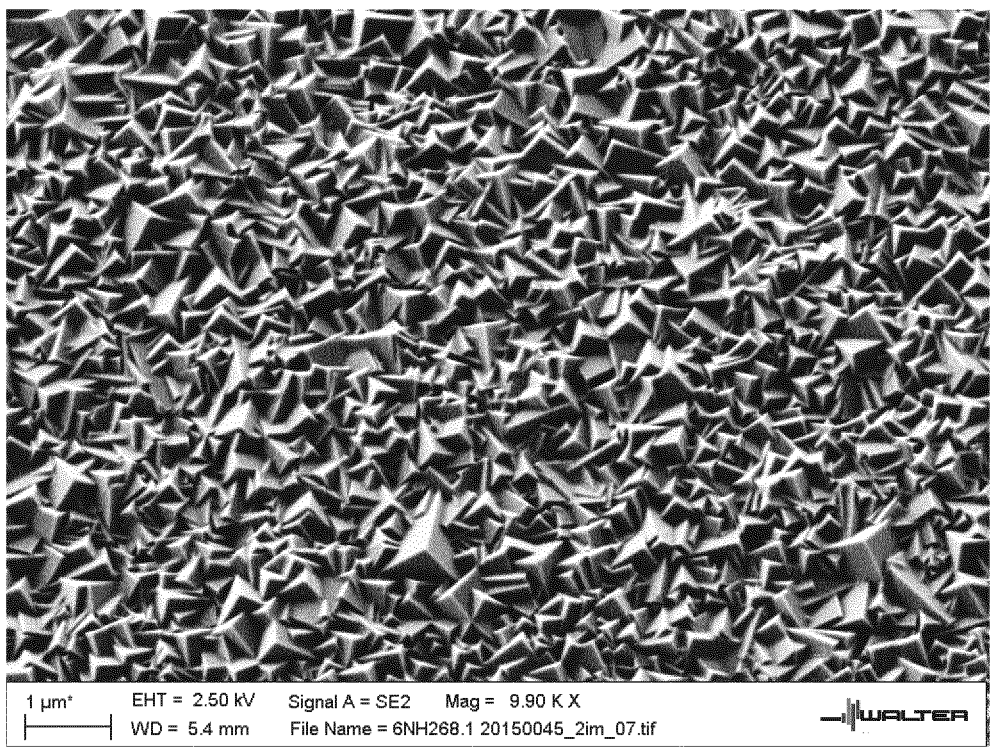
Figure 3b (sample # 3 – top view)

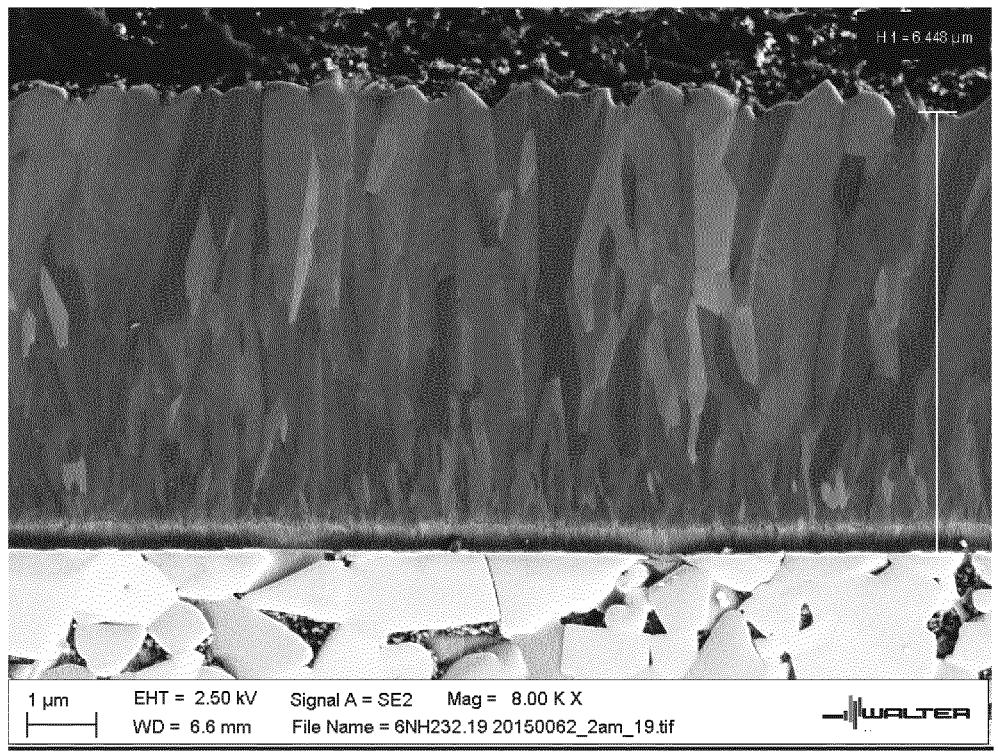
Figure 4a (sample # 4 – cross section)
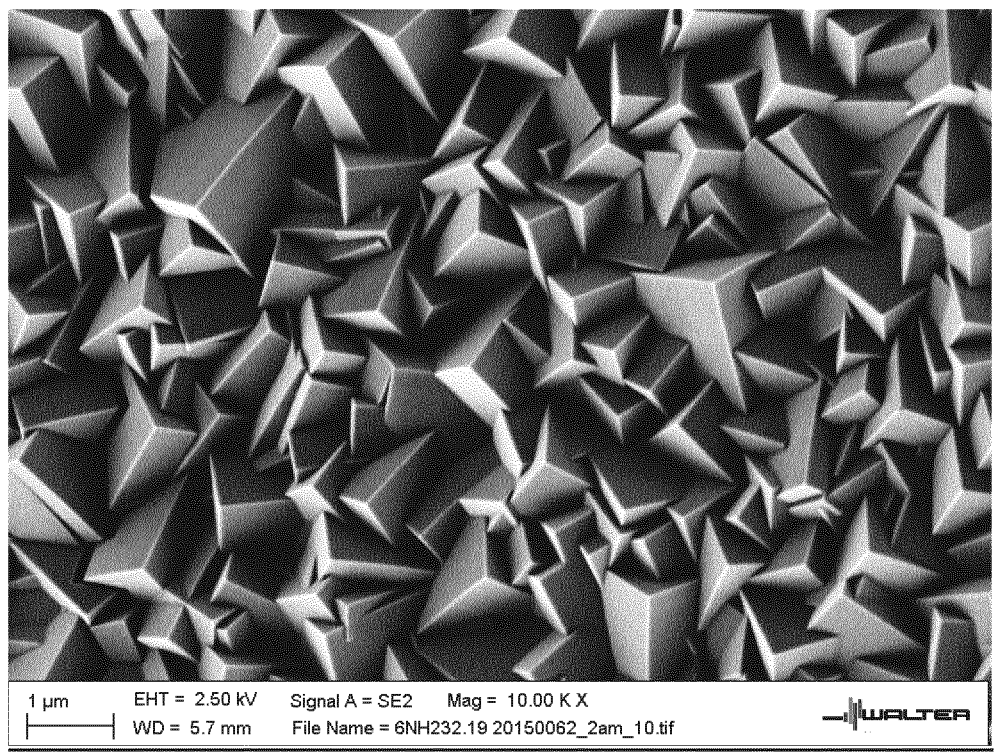
Figure 4b (sample # 4 – top view)

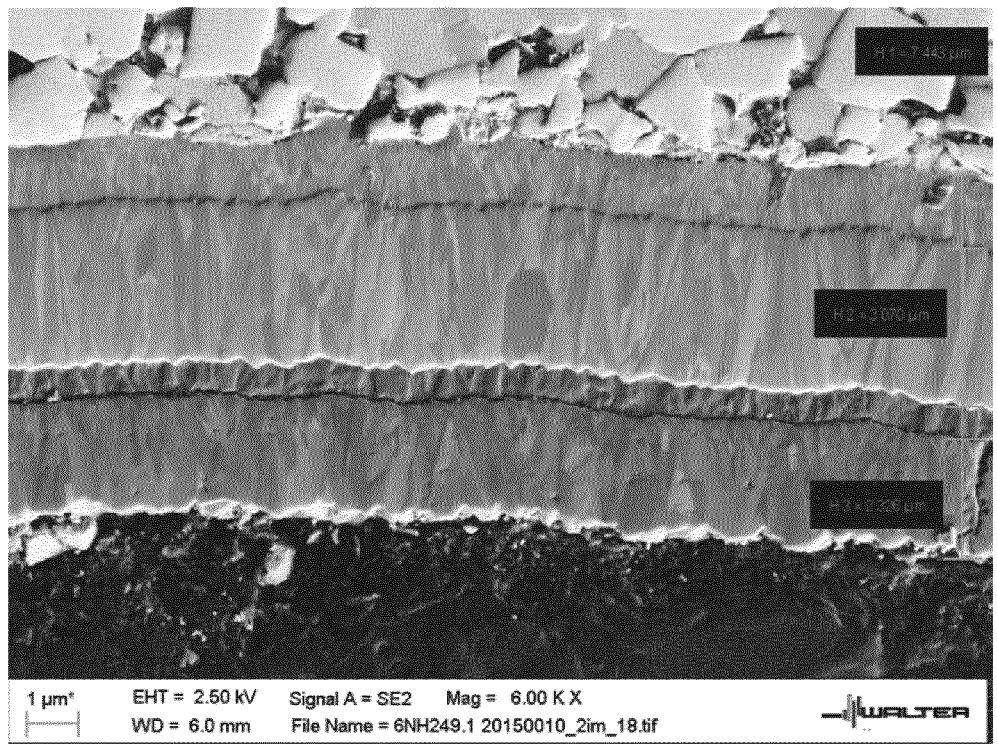
*Figure 5a (sample # 5 – cross section)*
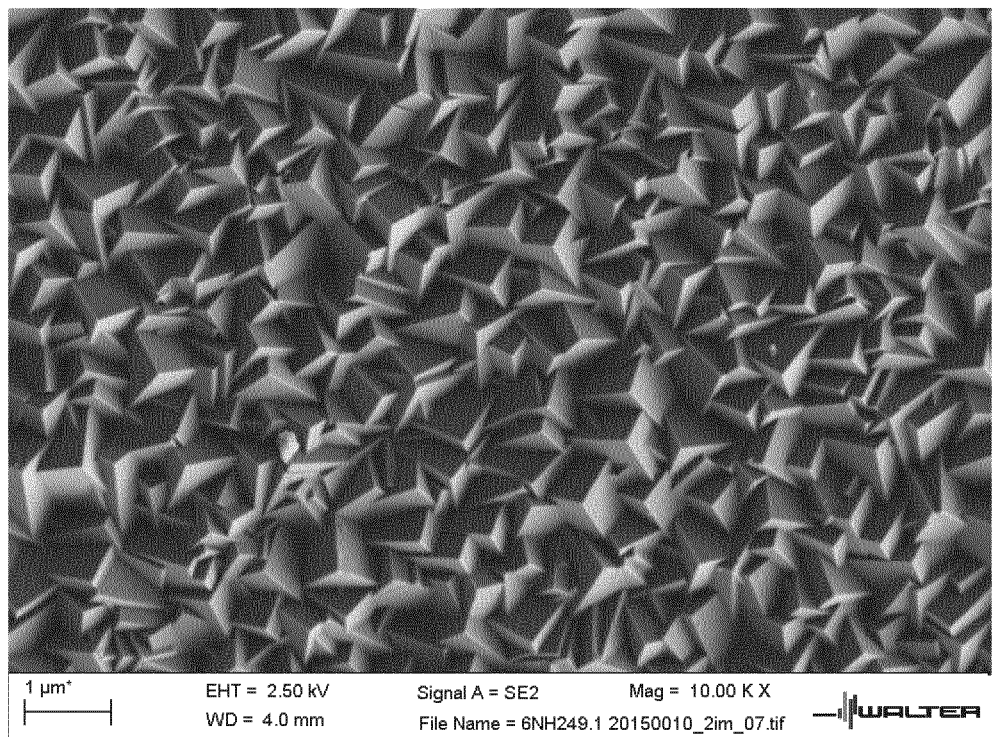
*Figure 5b (sample # 5 – top view)*

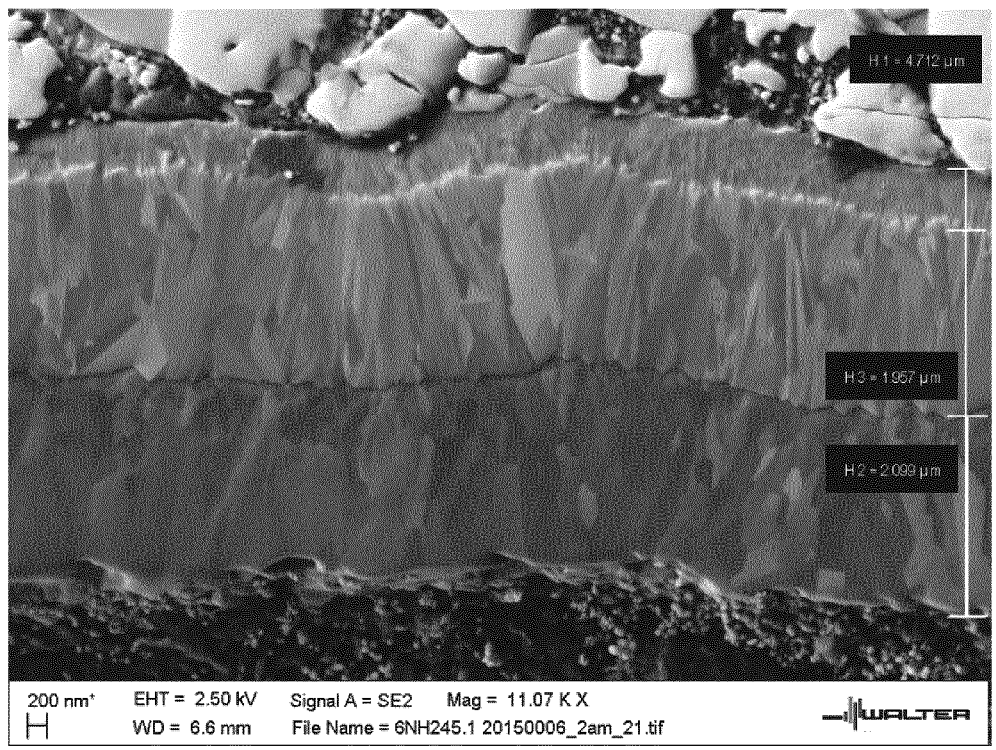
Figure 6a (sample # 6 – cross section)
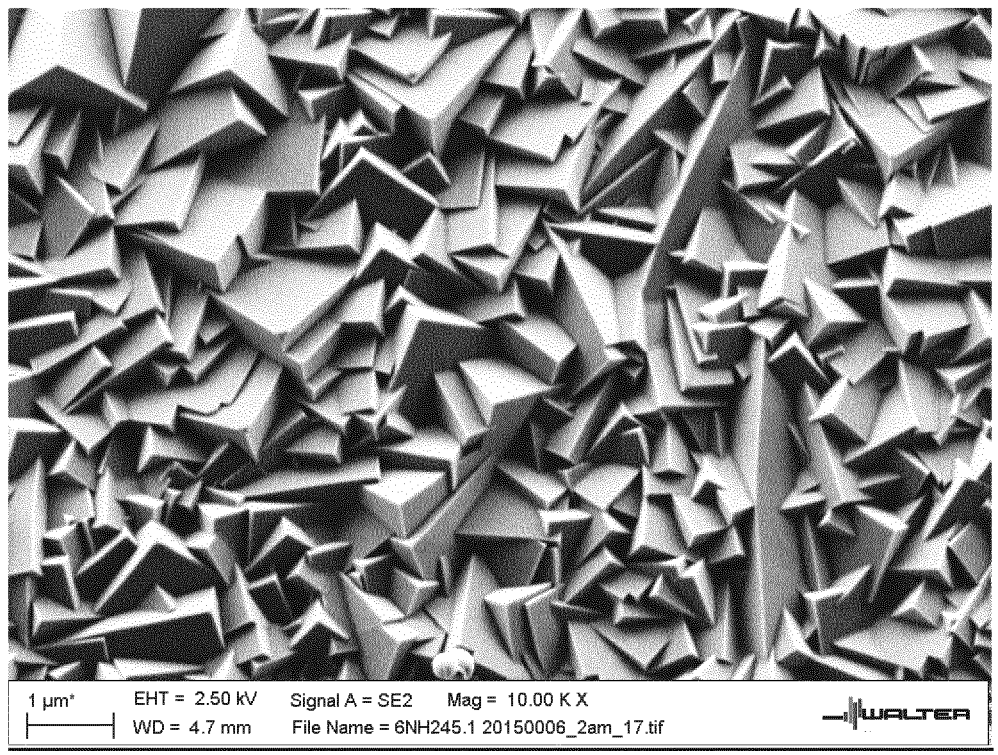
Figure 6b (sample # 6 – top view)

COATED CUTTING TOOL WITH H-ALN AND TI1-XALXCYNZ LAYERS

RELATED APPLICATION DATA

This application is a § 371 National Stage Application of PCT International Application No. PCT/EP2017/057728 filed Mar. 31, 2017 claiming priority to EP 16163243.5 filed Mar. 31, 2016.

FIELD OF THE INVENTION

The present invention relates to a cutting tool insert consisting of a coated cutting tool consisting of a substrate of cemented carbide, cermet, ceramics, steel or cubic boron nitride and a multi-layered wear resistant coating deposited thereon by chemical vapour deposition (CVD) or moderate temperature chemical vapour deposition (MT-CVD) and comprising at least one layer of TiAlN or TiAlCN.

BACKGROUND OF THE INVENTION

The wear resistance of cutting tools is often improved by hard refractory coatings usually deposited by CVD or PVD techniques. Coatings of polycrystalline structure are known to grow with a preferential crystallographic orientation (fiber texture) with respect to the substrate surface. The preferential crystallographic orientation (fiber texture) may depend on several factors, such as coating composition, nucleation and deposition conditions, deposition surface etc. It is known that the preferential crystallographic orientation of the coating may have a significant influence on the mechanical and cutting properties of the coated cutting tool. For instance, $\alpha$-$Al_2O_3$ coatings having preferential crystallographic orientation with the crystallographic planes {001} growing perpendicular to the substrate surface have been described to exhibit superior properties in many cutting applications.

The preferential crystallographic orientation (fiber texture) may be induced by the layer growth conditions, which may for kinetic or thermodynamic reasons favor the growth along certain crystallographic directions (growth texture), or it may be induced by the crystallographic orientation or structure of an underlying layer or substrate (texture by epitaxy). The control of the preferential crystallographic orientation (fiber texture) in CVD coatings by choice of suitable process conditions is well established, especially for the most commonly applied coating layer compositions, such as Ti(C,N), TiAl(C,N) or $\alpha$-$Al_2O_3$. Parameters which determine the preferential crystallographic orientation (fiber texture) may be the choice and the flow ratios of reactive gases and/or catalyst gases.

JP2014-128837 discloses a surface-coated cutting tool that is described to exert improved anti-chipping properties and defect resistance in high-speed intermittent cutting. The hard coating is deposited by CVD and comprises a $(Ti_{1-x}Al_x)(C_yN_{1-y})$ layer with $0.80 \leq x \leq 0.95$ and $0.005 \leq y \leq 0.05$. The $(Ti_{1-x}Al_x)(C_yN_{1-y})$ layer has a total thickness of 1 to 20 µm, and it is interrupted along its thickness by a plurality of 1-10 nm thin $(Ti_{1-x}Al_x)(C_yN_{1-y})$ fragmentation layers of a lower Al content of $0.50 \leq x \leq 0.70$ and $0.005 \leq y \leq 0.05$. The fragmentation layers are present in a density of 10 to 50 layers per 1 µm layer thickness in the layer thickness direction, and they are obtained in the CVD deposition process by the application of pulses of lower concentrations of the aluminum precursors $AlCl_3$ and $Al(CH_3)_3$ in the process gas mixture. The effect of the fragmentation layers is an interruption in the columnar grain growth of the $(Ti_{1-x}Al_x)(C_yN_{1-y})$ layer, and this interruption is supposed to restrict the anisotropy of the coating properties and to result in favorable mechanical behavior. The $(Ti_{1-x}Al_x)(C_yN_{1-y})$ layer has a cubic crystal structure.

WO 2014/034730 discloses a cutting tool with a CVD hard coating layer composed of alternating $(Ti_{1-x}Al_x)(C_yN_{1-y})$ layers A and B, wherein the A layers have a composition of $0.70 \leq x \leq 0.80$ and $0.0005 \leq y \leq 0.005$ and an average grain width $W \leq 0.1$ µm and grain length $L \leq 0.1$ µm, and the B layers have a composition of $0.85 \leq x \leq 0.95$ and $0.0005 \leq y \leq 0.005$ and an average grain width $0.1$ µm$\leq W \leq 2.0$ µm and grain length $0.5$ µm$\leq L \leq 5.0$ µm, and the topmost layer of the alternating stacked structure is an A layer. In a preferred embodiment, both layers consist of a mixture of hexagonal and cubic phases as determined by electron backscatter diffraction (EBSD) measurements, wherein the A layer has a surface area fraction of cubic/(cubic+hexagonal) phase of $\geq 50\%$, and the B layer consists of a higher surface area fraction of hexagonal phase with a ratio hexagonal/(cubic+hexagonal) phase $\geq 50\%$.

The unexamined Japanese patent application JP 2002-273607 A discloses a CVD multi-layer coating of alternating TiCN and AlN layers, wherein the TiCN layers are grown by a MT-CVD process and have a preferential growth orientation of a (422) or (311) texture. The addition of AlN interlayers is said to enhance oxidation resistance and crack resistance of the coating. No information is given about the phase of the AlN layer. Both layers preferably have a columnar microstructure. The AlN layers do not alter the texture of the MT-TiCN layers, and they seem not to induce a grain refinement of the TiCN layers.

OBJECT OF THE INVENTION

It is an object of the present invention is to provide a coated cutting tool with a more fine grained and smooth surface coating having enhanced resistance against wear in intermittent cutting, especially enhanced resistance against abrasive wear and chipping of the coating from the cutting edge.

DESCRIPTION OF THE INVENTION

The present invention provides a coated cutting tool consisting of a substrate of cemented carbide, cermet, ceramics, steel or cubic boron nitride and a multi-layered wear resistant coating, wherein the multi-layered wear resistant coating has a total thickness from 5 to 25 µm and comprises refractory coating layers deposited by chemical vapour deposition (CVD) or moderate temperature chemical vapour deposition (MT-CVD), and the multi-layered wear resistant coating comprises at least one pair of layers (a) and (b) with layer (b) being deposited immediately on top of layer (a), wherein layer (a) is a layer of aluminium nitride having hexagonal crystal structure (h-AlN) and a thickness from 10 nm to 750 nm, and layer (b) is a layer of titanium aluminium nitride or titanium aluminium carbonitride represented by the general formula $Ti_{1-x}Al_xC_yN_z$ with $0.4 \leq x \leq 0.95$, $0 \leq y \leq 0.10$ and $0.85 \leq z \leq 1.15$, having a thickness from 0.5 µm to 15 µm, and at least 90% of the $Ti_{1-x}Al_xC_yN_z$ of layer (b) has a face-centered cubic (fcc) crystal structure.

TiAlCN and TiAlN layers are generally known as useful hard refractory coating layers to improve the wear resistance and cutting properties of cutting tools, especially for metal working. However, if the TiAlCN or TiAlN layer is too thin, it will wear more rapidly and may not exert its beneficial effect on wear resistance and cutting properties. On the other hand, if the TiAlCN or TiAlN layer growth too thick during CVD deposition it may develop undesired phases and microstructure that impair its wear resistance and cutting properties, and the grain sizes may become large resulting in undesired hardness properties or uneven evolution of wear due to tear-out of grains from the coating.

The present inventors have now found that the properties of hard coatings comprising TiAlCN or TiAlN layers can be improved by depositing a layer (a) of aluminium nitride having hexagonal crystal structure (h-AlN) underneath a $Ti_{1-x}Al_xC_yN_z$ layer (b) of the type defined herein to get one or more pairs of layers (a) and (b) in the coating. Thereby, the outermost wear resistant layer of the coating is preferably a $Ti_{1-x}Al_xC_yN_z$ layer (b) as the top coating layer. As an alternative, one or more thin top coating layers may be deposited on top of the $Ti_{1-x}Al_xC_yN_z$ layer (b), such as a thin TiN layer of for example about 0.5 µm thickness that is usually applied as a lubricating and/or decorative and/or wear indicating top layer on the outermost surface of such cutting tools.

The coating of the present invention may comprise one single pair of a h-AlN layer (a) and a $Ti_{1-x}Al_xC_yN_z$ layer (b) or several pairs of h-AlN layers (a) and $Ti_{1-x}Al_xC_yN_z$ layers (b) in sequence, depending on the desired properties of the cutting tool.

The present invention includes those embodiments comprising further hard refractory layers between the substrate surface and the first pair of layers (a) and (b) and/or between the pairs of layers (a) and (b). As will be discussed below in more detail, in the present invention there is at least one further hard refractory layer provided between the substrate surface and immediately underneath the first h-AlN layer (a) of the first pair of layers (a) and (b). Such further hard refractory layer may preferably be selected from TiAlCN, TiAlN, TiCN and TiN having columnar or equiaxed crystal morphology, preferably columnar crystal morphology. The further hard refractory layer selected from TiAlCN, TiAlN, TiCN and TiN may have the same or different preferred crystallographic growth orientation (fiber texture) that is herein characterized by the texture coefficient TC.

The inventors of the present invention have surprisingly found that the $Ti_{1-x}Al_xC_yN_z$ layer (b) within the one or several pairs of h-AlN layers (a) and $Ti_{1-x}Al_xC_yN_z$ layers (b) can be produced with a preferred crystallographic growth orientation (fiber texture), preferably a {111} texture, independent whether the further hard refractory layer provided between the substrate surface and immediately underneath the first h-AlN layer (a) of the first pair of layers (a) and (b) has the same or different preferred crystallographic growth orientation (fiber texture) and independent whether this the further hard refractory layer has columnar or equiaxed crystal morphology.

Without being bound to a theory, the inventors assume that the provision of the layer (a) of hexagonal aluminium nitride (h-AlN) provides a high density of nucleation sites for the nucleation of the $Ti_{1-x}Al_xC_yN_z$ layer (b) growing to a high degree in the desired face-centered cubic (fcc) crystal structure in the CVD process. Further, the inventors have found that by providing the layer (a) of hexagonal aluminium nitride (h-AlN) it is possible to produce a fine grained $Ti_{1-x}Al_xC_yN_z$ layer (b) with a desired crystal growth orientation (fiber texture) and microstructure to improve the properties of the entire coating. It has further been found that providing the layer (a) of hexagonal aluminium nitride (h-AlN) on a further hard refractory layer provided immediately underneath the h-AlN layer (a) allows for a change of the preferred crystallographic growth orientation (fiber texture) from the further hard refractory layer to the $Ti_{1-x}Al_xC_yN_z$ layer (b) on top of the h-AlN layer (a), for example a change from {200} or {422} texture in the further hard refractory layer to a {111} texture in the $Ti_{1-x}Al_xC_yN_z$ layer (b).

At the same time, it has further surprisingly been found that, despite the very different crystal symmetries of the hexagonal h-AlN layer (a) and the face-centered cubic (fcc) $Ti_{1-x}Al_xC_yN_z$ layer (b), the bonding and adhesion between the layers (a) and (b) and also between layer (a) and a further hard refractory layer deposited underneath the hexagonal h-AlN layer (a) is very good. This could not be expected in view of the knowledge from the prior art that the bonding and adhesion between known other layers of different crystal symmetries, such as for example between fcc TiCN and rhombohedral $\alpha$-$Al_2O_3$, is rather unsatisfying.

The inventors have also found that by providing the layer (a) of hexagonal aluminium nitride (h-AlN) it is possible to achieve a very smooth surface structure of the $Ti_{1-x}Al_xC_yN_z$ layer (b) of low surface roughness. It is assumed that this has to do with the crystal growth orientation (fiber texture) and less pronounced surface facets achieved for the $Ti_{1-x}Al_xC_yN_z$ layer (b).

In one embodiment of the present invention the multi-layered wear resistant coating of the coated cutting tool comprises one single pair of a h-AlN layer (a) and a $Ti_{1-x}Al_xC_yN_z$ layer (b) and at least one further hard refractory layer immediately underneath the h-AlN layer (a). It is assumed that the h-AlN layer (a) acts as a re-nucleation layer which prevents the $Ti_{1-x}Al_xC_yN_z$ layer (b) from growing epitaxial on the lower hard refractory layer. This leads to advantageous effects. The grain growth of the further hard refractory layer is interrupted by the h-AlN layer (a), and thus, the growth of $Ti_{1-x}Al_xC_yN_z$ grains is initiated or nucleated, respectively, on the h-AlN layer (a) and is not continued from the grains of the further refractory layer. Accordingly, the grain sizes of the further hard refractory layer as well as of the $Ti_{1-x}Al_xC_yN_z$ layer (b) are limited and kept relatively small. Further, due to the h-AlN layer (a) the $Ti_{1-x}Al_xC_yN_z$ layer (b) does not grow in an epitaxial manner on the further hard refractory layer, thus, the $Ti_{1-x}Al_xC_yN_z$ layer (b) can be grown with a different preferential crystallographic orientation (texture) than the further hard refractory layer. This provides the possibility to grow both the lower further refractory layer and the upper $Ti_{1-x}Al_xC_yN_z$ layer (b) with different desired preferential crystallographic orientations. This allows for an optimization of the coating properties under the aspect of the preferential crystallographic orientations of the individual layers.

For example, it is known that in the fcc phase of $Ti_{1-x}Al_xN$ coatings the elastic anisotropy changes significantly with chemical composition. The Young's modulus ratio $E^{111}/E^{100}$ increases continuously from about 0.7 for TiN (x=0) to 2.1 for AlN (x=1) [F. Tasnadi et al., Applied Physics Letters 97, 231902 (2010)] so that pure TiN or Ti-rich $Ti_{1-x}Al_xN$ coatings are expected to have superior wear resistance when having a {100} preferential crystallographic orientation (texture), whereas for Al-rich or pure AlN coatings better wear resistance is expected in case of a {111} preferential crystallographic orientation (texture). The present invention thus opens the possibility to develop texture-engineered multilayer wear resistant coatings combining optimal crystallographic textures of different wear resistant layers.

In another embodiment of the present invention the multi-layered wear resistant coating of the coated cutting tool comprises a sequence of two or more pairs of h-AlN layers (a) and $Ti_{1-x}Al_xC_yN_z$ layers (b). Preferably, the multi-layered wear resistant coating of the coated cutting tool comprises a sequence of 2, 3, 4, 5, 6, 7, 8, 9, or 10 pairs of layers (a) and (b). Preferably, there is provided at least one further hard refractory layer immediately underneath the first h-AlN layer (a), i.e. between the substrate surface and the first pair of layers (a) and (b). By providing a sequence of several pairs of layers (a) and (b), the $Ti_{1-x}Al_xC_yN_z$ layer will retain a relatively small average grain size even at higher overall coating thicknesses, thus preventing the formation of a coarse grained microstructure which impairs wear resistance and cutting properties, e.g. by pull-out of large grains. At the same time, compared to a $Ti_{1-x}Al_xC_yN_z$ layer (b) deposited as a single layer of approximately the same thickness as the thickness of multiple pairs of layers (a) and (b), a smooth surface structure of the outer $Ti_{1-x}Al_xC_yN_z$ layer (b) of low surface roughness with less pronounced surface facets is achieved.

According to the present invention, the thickness of each of the h-AlN layers (a) is within the range from 10 nm to 750 nm. If the h-AlN layer(s) (a) are too thin, the desired hexagonal phase may not form since the AlN coating layer continues to grow for several nanometers in the metastable cubic phase of AlN when the substrate or the further hard refractory layer immediately underneath has cubic structure as well. If the h-AlN layer(s) (a) are too thick, the total entire coating may be less wear resistant due to the softness of the hexagonal phase. More preferably the thickness of the h-AlN layer(s) (a) is from 10 nm to 400 nm, preferably from 25 nm to 250 nm, most preferably from 40 nm to 100 nm.

According to the present invention, the thickness of each of the $Ti_{1-x}Al_xC_yN_z$ layers (b) is from 0.5 µm to 15 µm. Preferably the thickness of each of the $Ti_{1-x}Al_xC_yN_z$ layers (b) is from 1 µm to 8 µm. If the $Ti_{1-x}Al_xC_yN_z$ layers (b) are too thin, the overall ratio of cubic phase to hexagonal phase of the h-AlN layers (a) becomes too low and the wear resistance deteriorates due to the softness of the hexagonal phase. Also a desired growth texture may not sufficiently evolve in a too thin $Ti_{1-x}Al_xC_yN_z$ layer (b). If the $Ti_{1-x}Al_xC_yN_z$ layers (b) are too thick the grain size of each of the $Ti_{1-x}Al_xC_yN_z$ layers (b) may get too large leading to brittle behaviour and uneven wear.

In another embodiment of the present invention the thickness ratio of the thickness of the h-AlN layer (a) to the thickness of the $Ti_{1-x}Al_xC_yN_z$ layer (b) within each pair of layers (a) and (b) with layer (b) being deposited immediately on top of layer (a) is within the range from 0.01 to 0.5. If the thickness ratio is too low, the h-AlN layer (a) may become too thin to fully cover the underlying substrate and to develop a structure providing nucleation sites for growth of the $Ti_{1-x}Al_xC_yN_z$ layer (b). If the ratio is too high, the wear resistance deteriorates due to the softness of the hexagonal phase.

In another embodiment of the present invention the h-AlN layers (a) have a chlorine content of less than 5 at.-%, preferably less than 2.5 at.-%, most preferably less than 1 at. % or a chlorine content of 2-3 at.-%. Without being bound to a theory concerning the origin and effect of the chlorine content in h-AlN layers (a), the inventors believe that due to the high growth rate usually observed in the deposition of the h-AlN layers (a) and the relatively low process temperature, chlorine is incorporated into the fine grained structure of the coating at the grain boundaries or other crystallographic defects. While the fine grained structure is desired to obtain the re-nucleation effect for growth of the $Ti_{1-x}Al_xC_yN_z$ layer (b), a too high chlorine content in the h-AlN layers (a) will lead to a softening of the layer. Therefore, it is advantageous for the entire coating to have a chlorine content is in the range specified above for the h-AlN layers (a). And, the skilled person will know or find by a low number of experiments how to set the process conditions to achieve the desired chlorine content.

In another embodiment of the present invention the $Ti_{1-x}Al_xC_yN_z$ layers of the type (b) within a pair of layers (a) and (b) with layer (b) being deposited immediately on top of layer (a) have a columnar grain morphology and a preferred crystallographic growth orientation characterized by a texture coefficient TC (111)>1.8, the TC (111) being defined as follows:

$$TC(111) = \frac{I(111)}{I_0(111)} \left[ \frac{1}{n} \sum_{i=1}^{n} \frac{I(hkl)_i}{I_0(hkl)_i} \right]^{-1}$$

wherein
I(111)=measured intensity of the (111) reflection
$I_0$(111)=standard intensity of the (111) reflection of the standard powder diffraction data according to the applied JCPDF-card no. 00-046-1200
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200
n=number of reflections used in the calculation (here: n=4)
(hkl)$_i$ the (hkl)$_i$ reflections used are: (111), (200), (220) and (311).

The elastic anisotropy of $Ti_{1-x}Al_xC_yN_z$ layers of the type (b) having an Al-rich chemical composition according to this invention is such that the elastic modulus is highest along the <111> crystallographic direction, and the {111} textured $Ti_{1-x}Al_xC_yN_z$ layers show superior wear resistance. In particular, the inventors found that {111} textured layers show superior resistance against the occurrence of thermal cracks.

As stated before, the multi-layered wear resistant coating of the of the present invention may comprise at least one further hard refractory layer between the substrate surface and the first pair of layers (a) and (b), i.e. underneath the first h-AlN layer of the type (a). In a preferred embodiment of the invention the multi-layered wear resistant coating comprises a layer selected from the group consisting of titanium nitride (TiN), titanium carbonitride (TiCN), titanium aluminium nitride (TiAlN) and titanium aluminium carbonitride (TiAlCN), said layer being deposited immediately underneath the first h-AlN layer of the type (a) and having preferably a columnar grain morphology. The combination of the further hard refractory layer with the pair of layers (a) and (b) in the multi-layered wear resistant coating of the present invention allows the person skilled in the art to design coatings for specific purposes, e.g. combining the high abrasive wear resistance of {211} textured MT-TiCN layers with the resistance of {111} textured $Ti_{1-x}Al_xC_yN_z$ layers of the type (b) against thermal shock.

In one embodiment of the present invention the aforementioned further hard refractory layer deposited immediately underneath the first h-AlN layer of the type (a) is a TiAlN, TiAlCN, TiN or TiCN layer and has a preferred crystallographic growth orientation characterized by a texture coefficient TC (200)>1.8, the TC (200) being defined as follows:

$$TC(200) = \frac{I(200)}{I_0(200)} \left[ \frac{1}{n} \sum_{i=1}^{n} \frac{I(hkl)_i}{I_0(hkl)_i} \right]^{-1}$$

wherein

I(200)=measured intensity of the (200) reflection
$I_0$(200)=standard intensity of the (200) reflection of the standard powder diffraction data according to the applied JCPDF-card no. 00-046-1200 when the said layer is a TiAlN or TiAlCN layer, and according to JCPDF card no. 00-42-1489 when the said layer is a TiN or TiCN layer
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200 when the said layer is a TiAlN or TiAlCN layer, and according to JCPDF card no. 00-42-1489 when the said layer is a TiN or TiCN layer
n=number of reflections used in the calculation (here: n=4)
(hkl)$_i$ the (hkl)$_i$ reflections used are: (111), (200), (220) and (311).

The TiAlN, TiAlCN, TiN or TiCN layer as the further hard refractory layer has favourable mechanical properties associated with the {200} texture, and, if combined with the {111} textured Ti$_{1-x}$Al$_x$C$_y$N$_z$ layer (b) having superior wear resistance, it provides superior overall properties of the coating.

In another embodiment of the present invention the aforementioned further hard refractory layer deposited immediately underneath the first h-AlN layer (a) is a layer of titanium carbonitride (TiCN) and has a preferred crystallographic growth orientation characterized by a texture coefficient TC (422)>1.8, the TC (422) being defined as follows:

$$TC(422) = \frac{I(422)}{I_0(422)} \left[ \frac{1}{n} \sum_{i=1}^{n} \frac{I(hkl)_i}{I_0(hkl)_i} \right]^{-1}$$

wherein

I(422)=measured intensity of the (422) reflection
$I_0$(422)=standard intensity of the (422) reflection of the standard powder diffraction data according to the applied JCPDF-card no. 00-42-1489
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-42-1489
n=number of reflections used in the calculation (here: n=5)
(hkl)$_i$ the (hkl)$_i$ reflections used are: (111), (200), (220), (311) and (422).

The TiCN layer with {211} texture, if used as the further hard refractory layer, has favourable properties especially with respect to abrasive wear resistance in continuous cutting operations, and, if combined with the {111} textured Ti$_{1-x}$Al$_x$C$_y$N$_z$ layer (b) having superior wear resistance, it provides favourable properties in operations which exert thermomechanical shocks on the cutting tool.

In another embodiment of the present invention the aforementioned further hard refractory layer deposited immediately underneath the first h-AlN layer of the type (a) is a layer of titanium aluminium nitride (TiAlN) or titanium aluminium carbonitride (TiAlCN) and has a preferred crystallographic growth orientation characterized by a texture coefficient TC (111)>1.8, the TC (111) being defined as follows:

$$TC(111) = \frac{I(111)}{I_0(111)} \left[ \frac{1}{n} \sum_{i=1}^{n} \frac{I(hkl)_i}{I_0(hkl)_i} \right]^{-1}$$

wherein

I(111)=measured intensity of the (111) reflection
$I_0$(111)=standard intensity of the (111) reflection of the standard powder diffraction data according to the applied JCPDF-card no. 00-046-1200
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200
n=number of reflections used in the calculation (here: n=4)
(hkl)$_i$ the (hkl)$_i$ reflections used are: (111), (200), (220) and (311).

This embodiment of the invention provides a coating with a plurality of {111} textured titanium aluminium nitride (TiAlN) or titanium aluminium carbonitride (TiAlCN) layers having superior wear resistance due to the anisotropy of mechanical properties of the coating material, while having smaller grains than a single layer of the same material.

In one embodiment of the present invention the first h-AlN layer (s) of the type (a) has a W content of less than 0.1 at.-%., and/or a Co content of less than 0.1 at.-%, and/or a Ti content of less than 0.5 at.-%, preferably a Ti content of less than 0.3 at.-%.

According to the present invention, at least 90% of each of the Ti$_{1-x}$Al$_x$C$_y$N$_z$ of layers (b) have a face-centered cubic (fcc) crystal structure. However, it is even more preferred that at least 95%, or at least 97% of the Ti$_{1-x}$Al$_x$C$_y$N$_z$ of layer (b) have face-centered cubic (fcc) crystal structure.

When choosing inappropriate process conditions, the Ti$_{1-x}$Al$_x$C$_y$N$_z$ of layer (b) may be deposited with significant amounts of hexagonal phase, which is softer than the fcc structure has a poorer wear resistance. It is therefore desirable to have Ti$_{1-x}$Al$_x$C$_y$N$_z$ layers (b) with nearly 100% face-centered cubic (fcc) crystal structure in the as deposited state.

If the further hard refractory layer underneath the h-AlN layer (a) is TiAlN, TiAlCN, TiN or TiCN layer, the inventors of the present application have observed by electron diffraction in the transmission electron microscope or by FFTs of HR-TEM images that the {001} planes of the h-AlN are oriented parallel to the {001} planes of the layer directly underneath. Such {001} planes of the layer directly underneath are usually not oriented parallel to the substrate surface or perpendicular to the layer growth direction, respectively. For example, if the further hard refractory layer is TiAlN or TiAlCN with a preferred growth orientation with a {111} texture, i. e. the crystallographic plane {111} growing parallel to the substrate surface, the {001} crystallographic planes including an angle of about 54.7° with the {111} crystallographic planes, and the {001} crystallographic planes (facets) terminate the further hard refractory layer. And, independent whether the further hard refractory layer of fcc structure has {200}, {422} or {111} texture, the Ti$_{1-x}$Al$_x$C$_y$N$_z$ layer (b) above the h-AlN layer (a) can preferably be grown with a {111} texture, i.e. in a non-epitaxial relation to the hard refractory layer. Thus, the inventors have found that the h-AlN layer (a) is useful to break the epitaxy between the hard refractory layer underneath and the $Ti_{1-x}Al_xC_yN_z$ layer (b) above the h-AlN layer (a), and, at the same time, provides a high density of re-nucleation sites for the growth of the $Ti_{1-x}Al_xC_yN_z$ layer (b).

BRIEF DESCRIPTION OF THE FIGURES

The figures show SEM microphotographs of the samples prepared according to the examples described below.

FIGS. 1a, 1b show SEM microphotographs of a cross section (FIG. 1a) and of a top view onto the surface (FIG. 1b) of sample #1 (according to the invention);

FIGS. 2a, 2b show SEM microphotographs of a cross section (FIG. 2a) and of a top view onto the surface (FIG. 2b) of sample #2 (according to the invention);

FIGS. 3a, 3b show SEM microphotographs of a cross section (FIG. 3a) and of a top view onto the surface (FIG. 3b) of sample #3 (according to the invention);

FIGS. 4a, 4b show SEM microphotographs of a cross section (FIG. 4a) and of a top view onto the surface (FIG. 4b) of sample #4 (comparative example);

FIGS. 5a, 5b show SEM microphotographs of a cross section (FIG. 5a) and of a top view onto the surface (FIG. 5b) of sample #5 (according to the invention);

FIGS. 6a, 6b show SEM microphotographs of a cross section (FIG. 6a) and of a top view onto the surface (FIG. 6b) of sample #6 (comparative example);

DEFINITIONS AND METHODS

Fiber Texture and Texture Coefficient TC

The term "fiber texture" or "texture", respectively, as used herein and as it is generally used in connection with thin films produced by vapor deposition, distinguishes the orientation of the grown grains from random orientation. Three types of textures are usually distinguished in thin films and coatings: (i) random texture, when grains have no preferred orientation; (ii) fiber texture, where the grains in the coating are oriented such that one set of geometrically equivalent crystallographic planes {hkl} is found to be preferentially oriented parallel to the substrate, while there is a rotational degree of freedom of the grains around the fiber axis which is perpendicular to this plane, and thus preferentially orientated perpendicular to the substrate; and (iii) epitaxial alignment (or in-plane texture) on single-crystal substrates, where an in-plane alignment fixes all three axes of the grain with respect to the substrate.

The crystallographic plane of a crystal is defined by the Miller indices, h, k, l. A means to express preferred growth, i. e. that one set of geometrically equivalent crystallographic planes {hkl} is found to be preferentially oriented parallel to the substrate, is the texture coefficient TC (hkl) calculated using the Harris formula on the basis of a defined set of XRD reflections measured on the respective sample. The intensities of the XRD reflections are standardized using a JCPDF-card indicating the intensities of the XRD reflections of the same material, e. g. TiCN, but with random orientation, such as in a powder of the material. A texture coefficient TC (hkl)>1 of a layer of crystalline material is an indication that the grains of the crystalline material are oriented with their {hkl} crystallographic plane parallel to the substrate surface more frequently than in a random distribution, at least compared to the XRD reflections used in the Harris formula to determine the texture coefficient TC.

X-Ray Diffraction (XRD) Measurements

X-ray diffraction measurements were done on a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample is avoided. On the secondary side a Soller slit with a divergence of 0.4° and a 25 μm thick Ni $K_β$ filter were used. Symmetrical θ-2θ scans within the angle range of 20°<2θ<155° with increments of 0.04° and 4 seconds counting time have been conducted. On the XRD raw data intensity corrections for thin film absorption were applied to all samples which take into account the limited thickness of the layer in contrast to the natural penetration depth in a bulk material. Furthermore an absorption correction was applied for samples where an additional layer was deposited above the layer for which the TCs were calculated. Finally $Kα_2$ stripping (Rachinger method), background subtraction and a parabolic peakfit with 5 measuring points were applied. Therefore, any XRD peak intensities indicated herein mean the accordingly corrected intensities. For the calculation of the texture coefficients TC(hkl) a formalism proposed by Harris [Harris, G. B., Philosophical Magazine Series 7, 43/336, 1952, pp. 113-123] was applied. Herein the corrected net peak intensities $I_{corr}$ were correlated to the relative intensities $I_{pdf}$ taken from PDF-card 00-42-1489 for TiN or TiCN layers and from PDF-card 00-046-1200 for TiAlN or TiAlCN layers.

$$TC(hkl) = \frac{I(hkl)}{I_0(hkl)}\left[\frac{1}{n}\sum_{i=1}^{n}\frac{I(hkl)_i}{I_0(hkl)_i}\right]^{-1}$$

Transmission Electron Microscopy (TEM) EDS Analysis

Transmission electron microscopic (TEM) analyses were performed in a FEI Titan 80-300 microscope with field emission cathode at an acceleration voltage of 300 kV. For EDS analyses an Oxford Inca EDS system was used. The preparation of samples for TEM was made by the in-situ lift-out technique using a combined FIB/SEM equipment to cut a thin cross sectional piece out of the surface and thin the sample down to sufficient electron transparency.

Crystal Structure Determination by Electron Backscatter Diffraction (EBSD)

The percentage of face-centered cubic (fcc) crystal structure of the $Ti_{1-x}Al_xC_yN_z$ of layer (b) was determined by EBSD analysis on polished cross-sections of the samples. The polishing was done according to the following procedure: 6 min grinding using a grinding disc Struers Plano 220 and water; 3 min polishing using Struers 9 μm MD-Largo diamond suspension; 3:40 min polishing using Struers 3 μm MD-dac diamond suspension; 2 min polishing using Struers 1 μm MD-Nap diamond suspension; at least 12 min chemical polishing using Struers OP-S colloidal silica suspension with 0.04 μm average particle size. Prior to SEM/EBSD analysis the specimens were ultrasonically cleaned in ethanol and demagnetized. Inspection of the accordingly prepared specimens in the FE-SE (typically using an Everhart-Thornley secondary electron detector at 2.5 kV acceleration voltage and working distances of 3-10 mm) showed that grains of face centered cubic $Ti_{1-x}Al_xC_yN_z$ layers are polished to a flat surface, showing a pronounced orientation contrast, whereas layers of h-AlN or h-AlN precipitated at grain boundaries of fcc-$Ti_{1-x}Al_xC_yN_z$ layers are etched considerably stronger than fcc-phase grains, and therefore the surface of these proportions of the coating is lower than the fcc phase, and does not have a flat surface. Due to this topography, proportions in the coating which consist of h-AlN will give poor EBSD patterns in the EBSD analysis described below.

EBSD analysis was performed in a Zeiss SUPRA40VP scanning electron microscope (SEM) with a field emission cathode using a 60 µm or 120 µm aperture and 15 kV acceleration voltage working in high current mode with a 70° incident angle of the electron beam to the polished samples surface at about 12 mm working distance. The EBSD detector was an EDAX Digiview camera, and the TSL OIM Data Collection 7 and TSL OIM Analysis 7 software packages were used for data collection and analysis, respectively. Typical acquisition and processing parameters for the EBSD maps are as follows: The map size was chosen with a length of about 25 µm parallel to the substrate surface and so that the entire thickness of the coating was covered using a ≤0.15 µm step size and a hexagonal grid of measurement points. A 4×4 or 8×8 binning and optionally a dynamic background subtraction is performed on the camera picture, using exposure times corresponding to 20 to 100 frames per second. However, as a rule, the preparation procedure described above yielded samples which gave diffraction patterns of the $Ti_{1-x}Al_xC_yN_z$ layers with sufficient quality without performing background subtraction procedures. Indexing of the diffraction pattern is done by Hough transformation. The data points thus recorded should ideally be indexed with an average confidence index (CI) of >0.2. The CI is calculated by the TSL OIM Analysis 7 software during automated indexing of the diffraction pattern.

In a first step, the EBSD map is cropped to get only the data points of the $Ti_{1-x}Al_xC_yN_z$ layer (b) to be analysed. In a second step, grain CI standardization is carried out applying a grain tolerance angle of 5° and a minimum grain size of 5 data points. In a third step, partitioning of the so generated data set is carried out applying the filter CI>0.1, i.e. all data points that, after grain CI standardization, have a lower confidence index are disregarded. The ratio (number of data points indexed as fcc phase after CI standardization and filtering/total number of data points in the cropped map) corresponds to an area ratio of fcc phase within the $Ti_{1-x}Al_xC_yN_z$ layer analysed (given in area-%). However, since pattern overlap and topography at grain boundaries lead to poor indexing of EBSD patterns obtained from fcc phase $Ti_{1-x}Al_xC_yN_z$, the values thus obtained represent a minimum fraction of fcc phase in the layer, the actual fraction being higher. Typically in $Ti_{1-x}Al_xC_yN_z$ coatings where XRD and SEM gives no indication of h-AlN, and which therefore consist practically of about 100% fcc phase, the EBSD measurement and processing method described above yields >95 area-% of the EBSD map indexed as fcc phase.

CVD Coatings

The CVD coatings were prepared in a radial flow reactor, type Bernex BPX 325S, having 1250 mm height and 325 mm outer diameter. Gas flow over the charging trays was radial from a central gas tube.

EXAMPLES

Sample Preparation

For the preparation of cutting tools according to the present invention and of comparative examples cemented carbide cutting tool substrate bodies (composition: 90.5 wt-% WC, 1.5 wt-% TaC+NbC and 8.0 wt-% Co; geometry: SEHW1204AFN) were coated in a cylindrical CVD reactor, type Bernex BPX 325S, having a height of 1250 mm and a diameter of 325 mm.

The gas flow over the substrate bodies was conducted radially from a central gas distribution tube, using a first and second precursor gas streams, PG1 and PG2. The first precursor gas stream, PG1, comprises, as far as required for the preparation of the desired coating, the gases $AlCl_3$, $TiCl_4$, $CH_3CN$, $N_2$ and hydrogen $H_2$, and the second precursor gas stream, PG2, comprises, as far as required for the preparation of the desired coating, $NH_3$ and $H_2$. The first and second precursor gas streams, PG1 and PG2, were introduced into the reactor separately and combined immediately before entry into the reaction zone, i.e. after the outlet of the gas distribution tube.

The experimental conditions for the deposition of the different layer types are given in the following table 1.

TABLE 1

Deposition conditions for CVD layers

| Layer type | Temp. [° C.] | Pressure [kPa] | Gas concentrations in precursor gas streams [Vol.-%] | | | | | | |
|---|---|---|---|---|---|---|---|---|---|
| | | | PG1 | | | | | PG2 | |
| | | | $TiCl_4$ | $AlCl_3$ | $CH_3CN$ | $N_2$ | $H_2$ | $NH_3$ | $H_2$ |
| $Ti_{1-x}Al_xN$ (1) | 700 | 1 | 0.014 | 0.13 | 0 | 0 | 52 | 0.30 | 47.6 |
| $Ti_{1-x}Al_xN$ (2) | 725 | 1 | 0.019 | 0.17 | 0 | 0 | 51.9 | 0.41 | 47.5 |
| h-AlN (1) | 700 | 0.3 | 0 | 0.24 | 0 | 0 | 47 | 1.14 | 51.6 |
| h-AlN (2) | 725 | 1 | 0 | 0.17 | 0 | 0 | 51.9 | 0.41 | 47.5 |
| TiN (1) | 790 | 2 | 0.44 | 0 | 0 | 43.3 | 32.5 | 2.16 | 21.6 |
| TiN (2) | 875 | 15 | 1.03 | 0 | 0 | 44 | 33 | 0 | 22 |
| TiN (3) | 850 | 15 | 1.03 | 0 | 0 | 44 | 33 | 0 | 22 |
| TiCN (1) | 825 | 7.5 | 1.77 | 0 | 0.47 | 10.9 | 65.2 | 0 | 21.7 |

Coatings with different layer sequences were prepared. The following table 2 shows the layer types, layer sequences, deposition times, thicknesses, fiber textures and texture coefficients of the individual layers of samples according to the invention and of comparative samples.

In table 2:
L1=first layer immediately on substrate body surface
L2=layer immediately underneath the first h-AlN layer (a)
L(a)=Layer (a) of the type h-AlN
L(b)=Layer (b) of the type $Ti_{1-x}Al_xC_yN_z$
n.d.=not determined
*=integral TC(hkl) for all $Ti_{1-x}Al_xC_yN_z$ layers

TABLE 2

Sample coatings according to the invention and comparative examples

| Sample # | | L1 | L2 | L(a) | L(b) | pairs of L(a) + L(b) |
|---|---|---|---|---|---|---|
| 1 (Inv.) | Layer type | TiN (1) | $Ti_{1-x}Al_xN$ (1) | h-AlN (1) | $Ti_{1-x}Al_xN$(1) | 1 |
| | Deposition time [min] | 75 | 10 | 4 | 80 | |
| | Layer thickness [μm] | 3.5 | 0.7 | 0.2 | 5 | |
| | Texture (hkl)/ | {100} | {100} EBSD | — | {111} | |
| | TC | TC(100) = 1.97 | TC n.d. | | TC(111) = 3.27 | |
| 2 (Inv.) | Layer type | TiN (2) | $Ti_{1-x}Al_xN$ (2) | h-AlN (2) | $Ti_{1-x}Al_xN$ (2) | 1 |
| | Deposition time [min] | 120 | 70 | 2 | 10 | |
| | Layer thickness [μm] | 0.5 | 6 | 0.25 | 0.7 | |
| | Texture (hkl) | n.d. | {111} | — | {111} | |
| | | | TC(111) = 1.89* | | TC(111) = 1.89* | |
| 3 (Inv.) | Layer type | TiN (3) | $Ti_{1-x}Al_xN$ (2) | h-AlN (2) | $Ti_{1-x}Al_xN$ (2) | 7 |
| | Deposition time [min] | 120 | 10 | 2 min/30 s/5 s/1 s/5 s/30 s/1 s | 7 × 10 | |
| | Layer thickness [μm] | 0.4 | 0.6 | 0.15/0.05/<0.05/<0.05/<0.05/<0.05/<0.05 | 7 × 0.6 | |
| | Texture (hkl) | n.d. | {111} | — | {111} | |
| | | | TC(111) = 1.98* | | TC(111) = 1.98* | |
| 4 (Comp.) | Layer type | TiN (3) | $Ti_{1-x}Al_xN$ (2) | — | — | — |
| | Deposition time [min] | 120 | 90 | | | |
| | Layer thickness [μm] | 0.4 | 7.5 | | | |
| | Texture (hkl) | n.d. | {111} | | | |
| | | | TC(111) = 2.97 | | | |
| 5 (Inv.) | Layer type | TiN (2) | TiCN (1) | h-AlN (2) | $Ti_{1-x}Al_xN$ (2) | 1 |
| | Deposition time [min] | 120 | 45 | 10 | 45 | |
| | Layer thickness [μm] | 0.8 | 3 | 0.7 | 3.5 | |
| | Texture (hkl) | n.d. | {422} | — | {111} | |
| | | | TC(422) = 1.89 | | TC(111) = 3.05 | |
| 6 (Comp.) | Layer type | TiN (2) | TiCN (1) | | $Ti_{1-x}Al_xN$ (2) | |
| | Deposition time [min] | 120 | 45 | | 45 | |
| | Layer thickness [μm] | 0.8 | 3 | | 3.5 | |
| | Texture (hkl) | n.d. | {211} | | {422} EBSD | |
| | | | TC(422) = 3.72 | | TC n.d. | |

EDS analysis were made on the TEM samples and for the AlN layer, Layer (a). No measurable content of W and Co was found in samples #1, #2 and #3. The Ti content was <0.3 at.-% in sample #1, 0.14 at.-% in #sample 2 and <0.5 at.-% in sample #3. The Cl content was 2.9 at.-% in sample #1, 2.6 at.-% in #sample 2 and 2.2 at.-% in sample #3.

observed over a milling distance of 4000 mm in 800 mm steps. The following table 3 shows the development of $V_{Bmax}$ over the milling distance. In the milling test the cutting tool with the coating according to the present invention (sample 5) showed a significantly higher resistance against flank wear than the comparative example.

TABLE 3

Cutting Test Results

| Milling Distance [mm] | Maximum Flank Wear $V_{Bmax}$ | | | | | |
|---|---|---|---|---|---|---|
| | Sample # 1 (Inv.) | Sample # 2 (Inv.) | Sample # 3 (Inv.) | Sample # 4 (Comp.) | Sample # 5 (Inv.) | Sample # 6 (Comp.) |
| 0 | 0 | 0 | 0 | 0 | 0 | 0 |
| 800 | 0.02 | 0.02 | 0.02 | 0.04 | 0.02 | 0.02 |
| 1600 | 0.04 | 0.02 | 0.03 | 0.04 | 0.04 | 0.04 |
| 2400 | 0.08 | 0.04 | 0.06 | 0.08 | 0.06 | 0.10 |
| 3200 | 0.12 | 0.08 | 0.08 | 0.10 | 0.10 | 0.18 |
| 4000 | 0.20 | 0.15 | 0.18 | 0.28 | 0.16 | 0.28 |

Cutting Tests

Milling operations using the cutting tool inserts of samples 1 to 6 were performed under the following conditions:
Workpiece material: Steel DIN 42CrMo4
Coolant: None
Feed per tooth: $f_z$=0.2 mm
Depth of cut: $a_p$=3 mm
Cutting speed: $v_c$=283 m/min
Setting angle: k=45°
The development of the maximum flank wear, $V_{Bmax}$, on the main cutting edge and the number of comb cracks were

The invention claimed is:

1. A coated cutting tool comprising:
    a substrate of cemented carbide, cermet, ceramics, steel or cubic boron nitride; and
    a multi-layered wear resistant coating, wherein the multi-layered wear resistant coating has a total thickness from 5 to 25 μm and includes refractory coating layers deposited by chemical vapour deposition (CVD) or moderate temperature chemical vapour deposition (MT-CVD), and the multi-layered wear resistant coating includes at least one pair of layers (a) and (b) with layer (b) being deposited immediately on top of layer (a), wherein layer (a) is a layer of aluminium nitride having hexagonal crystal structure (h-AlN) and a thickness from 10 nm to 750 nm with a chlorine content of less than 5 at.-% and layer (b) is a layer of titanium aluminium nitride represented by the general formula $Ti_{1-x}Al_xN_z$ with $0.4 \leq x \leq 0.95$, and $0.85 \leq z \leq 1.15$, having a thickness from 0.5 µm to 15 µm, and at least 90% of the $Ti_{1-x}Al_xN_z$ of layer (b) has a face-centered cubic (fcc) crystal structure, wherein the multi-layered wear resistant coating includes a layer selected from the group of titanium nitride (TiN), titanium carbonitride (TiCN), and titanium aluminium nitride (TiAlN), said layer being deposited immediately underneath the first h-AlN layer of type (a) and having a columnar grain morphology.

2. The coated cutting tool of claim 1, wherein the multi-layered wear resistant coating includes one pair of layers (a) and (b).

3. The coated cutting tool of claim 1, wherein the thickness of the h-AlN layer(s) of the type (a) is from 10 nm to 400 nm.

4. The coated cutting tool of claim 1, wherein the thickness of the fcc-$Ti_{1-x}Al_xN_z$ layer(s) of type (b) is from 1 µm to 8 µm.

5. The coated cutting tool of claim 1, wherein the thickness ratio of the thickness of the h-AlN layer(s) of the type 1 (a) to the thickness of the $Ti_{1-x}Al_xN_z$ layer(s) of type (b) within each pair of layers (a) and (b) with layer (b) being deposited immediately on top of layer (a) is within the range from 0.01 to 0.5.

6. The coated cutting tool of claim 1, wherein the $T_{1-x}Al_xN_z$ layer(s) of type (b) within a pair of layers (a) and (b) with layer (b) being deposited immediately on top of layer (a) has a columnar grain morphology and a preferred crystallographic growth orientation characterized by a texture coefficient TC (111)>1.8, the TC (111) being defined as follows:

$$TC(111) = \frac{I(111)}{I_0(111)} \left[ \frac{1}{n} \sum_{i=1}^{n} \frac{I(hkl)_i}{I_0(hkl)_i} \right]^{-1}$$

wherein
I(111)=measured intensity of the (111) reflection
$I_0$(111)=standard intensity of the (111) reflection of the standard powder diffraction data according to the applied JCPDF-card no. 00-046-1200
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200
n=number of reflections used in the calculation (here: n=4)
(hkl)$_i$ the (hkl)$_i$ reflections used are: (111), (200), (220) and (311).

7. The coated cutting tool of claim 1, wherein the layer deposited immediately underneath the first h-AlN layer of the type (a) has a preferred crystallographic growth orientation characterized by a texture coefficient TC (200)>1.8, the TC (200) being defined as follows:

$$TC(200) = \frac{I(200)}{I_0(200)} \left[ \frac{1}{n} \sum_{i=1}^{n} \frac{I(hkl)_i}{I_0(hkl)_i} \right]^{-1}$$

wherein
I(200)=measured intensity of the (200) reflection
$I_0$(200)=standard intensity of the (200) reflection of the standard powder diffraction data according to the applied JCPDF-card no. 00-046-1200 when the said layer is a TiAlN or TiAlCN layer, and according to JCPDF card no. 00-42-1489 when the said layer is a TiN or TiCN layer
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200 when the said layer is a TiAlN or TiAlCN layer, and according to JCPDF card no. 00-42-1489 when the said layer is a TiN or TiCN layer
n=number of reflections used in the calculation (here: n=4)
(hkl)$_i$ the (hkl)$_i$ reflections used are: (111), (200), (220) and (311).

8. The coated cutting tool of claim 1, wherein the layer deposited immediately underneath the first h-AlN layer of the type (a) is a layer of titanium carbonitride (TiCN) and has a preferred crystallographic growth orientation characterized by a texture coefficient TC (422)>1.8, the TC (422) being defined as follows:

$$TC(422) = \frac{I(422)}{I_0(422)} \left[ \frac{1}{n} \sum_{i=1}^{n} \frac{I(hkl)_i}{I_0(hkl)_i} \right]^{-1}$$

wherein
I(422)=measured intensity of the (422) reflection
$I_0$(422)=standard intensity of the (422) reflection of the standard powder diffraction data according to the applied JCPDF-card no. 00-42-1489
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-42-1489
n=number of reflections used in the calculation (here: n=5)
(hkl)$_i$ the (hkl)$_i$ reflections used are: (111), (200), (220), (311) and (422).

9. The coated cutting tool of claim 1, wherein the layer deposited immediately underneath the first h-AlN layer of the type (a) is a layer of titanium aluminium nitride (TiAlN) or titanium aluminium carbonitride (TiAlCN) and has a preferred crystallographic growth orientation characterized by a texture coefficient TC (111)>1.8, the TC (111) being defined as follows:

$$TC(111) = \frac{I(111)}{I_0(111)} \left[ \frac{1}{n} \sum_{i=1}^{n} \frac{I(hkl)_i}{I_0(hkl)_i} \right]^{-1}$$

wherein
I(111)=measured intensity of the (111) reflection
$I_0$(111)=standard intensity of the (111) reflection of the standard powder diffraction data according to the applied JCPDF-card no. 00-046-1200
I(hkl)$_i$=measured intensity of the (hkl)$_i$ reflection
$I_0$(hkl)$_i$=standard intensity of the (hkl)$_i$ reflection of the standard powder diffraction data according to the applied JCPDF-card no. 00-046-1200 n=number of reflections used in the calculation (here: n=4)

(hkl)$_i$ the (hkl)$_i$ reflections used are: (111), (200), (220) and (311).

10. The coated cutting tool of claim 1, wherein at least 95% of the $Ti_{1-x}Al_xN_z$ of layer (b) has a face-centered cubic (fcc) crystal structure.

11. The coated cutting tool of claim 1, wherein the multi-layered wear resistant coating includes a sequence of two or more pairs of layers (a) and (b).

12. The coated cutting tool of claim 11, wherein the sequence is 2, 3, 4, 5, 6, 7, 8, 9, or 10 pairs of layers (a) and (b).

\* \* \* \* \*